(12) United States Patent
Suzuki et al.

(10) Patent No.: US 8,388,296 B2
(45) Date of Patent: Mar. 5, 2013

(54) VERTICAL CAROUSEL AND VERTICAL TRANSPORTATION METHOD USING THE VERTICAL CAROUSEL

(75) Inventors: Toru Suzuki, Inuyama (JP); Takanori Izumi, Inuyama (JP)

(73) Assignee: Murata Machinery, Ltd., Kyoto-shi, Kyoto (JP)

( * ) Notice: Subject to any disclaimer, the term of this patent is extended or adjusted under 35 U.S.C. 154(b) by 848 days.

(21) Appl. No.: 12/264,495

(22) Filed: Nov. 4, 2008

(65) Prior Publication Data

US 2009/0116941 A1    May 7, 2009

(30) Foreign Application Priority Data

Nov. 7, 2007    (JP) ................................ 2007-289431

(51) Int. Cl.
*B65G 1/00*    (2006.01)
(52) U.S. Cl. ..................... 414/331.14; 414/221; 414/940
(58) Field of Classification Search ............. 414/331.02, 414/331.13, 331.14, 221, 940
See application file for complete search history.

(56) References Cited

U.S. PATENT DOCUMENTS

| | | | |
|---|---|---|---|
| 5,466,109 A | 11/1995 | Iizuka | |
| 6,847,861 B2 * | 1/2005 | Lunak et al. | 700/242 |
| 7,025,191 B2 * | 4/2006 | Lichti et al. | 198/347.1 |
| 7,210,889 B2 * | 5/2007 | McFarland | 414/331.02 |
| 7,278,532 B2 | 10/2007 | Martin | |
| 7,585,143 B2 * | 9/2009 | Hanaoka | 414/331.02 |
| 2004/0235397 A1 * | 11/2004 | Lack | 451/41 |
| 2004/0238326 A1 * | 12/2004 | Lichti | 198/475.1 |

FOREIGN PATENT DOCUMENTS

| | | |
|---|---|---|
| GB | 2002724 A | 2/1979 |
| JP | 60-39844 A | 3/1985 |
| JP | 60-180213 U | 11/1985 |
| JP | 62-121112 A | 6/1987 |
| JP | 62-230510 A | 10/1987 |
| JP | 63-267612 A | 11/1988 |
| JP | 3-83788 A | 4/1991 |

(Continued)

OTHER PUBLICATIONS

European Search Report dated Feb. 10, 2010, issued in corresponding European Patent Application No. 08018587.9.
Japanese Office Action dated Aug. 21, 2009, issued in corresponding Japanese Patent Application No. 2007-289431.
Japanese Office Action dated Dec. 25, 2009, issued in corresponding Japanese Patent Application No. 2007-289431.

*Primary Examiner* — Joshua Rudawitz
(74) *Attorney, Agent, or Firm* — Westerman, Hattori, Daniels & Adrian, LLP

(57) ABSTRACT

An inner wall surrounding an inner space for vertically circulating a rack, and an outer wall surrounding the inner wall are provided. Then, a rack is disposed in the inner space. A pair of extensions are provided at diagonal positions of the rack. The extensions are attached to an endless drive member in a manner that the extensions protrude toward an outer space between the inner wall and the outer wall through slits of the inner wall, and, a drive mechanism for a drive member is provided in the outer space. Further, a tunnel passing through the outer space to connect the inner space and an area outside of the vertical carousel is provided for transportation of an article into, and out of the tunnel.

9 Claims, 3 Drawing Sheets

FOREIGN PATENT DOCUMENTS

| | | |
|---|---|---|
| JP | 03-083790 A | 4/1991 |
| JP | 3-158320 A | 7/1991 |
| JP | 05-097352 A | 4/1993 |
| JP | 2002-104641 A | 4/2002 |
| JP | 2002-164408 A | 6/2002 |
| JP | 2006-21913 A | 1/2006 |
| JP | 2006-327773 A | 12/2006 |
| JP | 2007-269489 A | 10/2007 |

* cited by examiner

VERTICAL CAROUSEL AND VERTICAL TRANSPORTATION METHOD USING THE VERTICAL CAROUSEL

TECHNICAL FIELD

The present invention relates to a vertical carousel for transporting articles vertically in a clean room.

BACKGROUND ART

Patent Publication 1 (JP2002-104641A) discloses an example of a vertical carousel. In the case of providing the vertical carousel of this type in a clean room, in the presence of dust particles emitted from mechanical parts of the carousel, it is necessary to prevent contamination of transported articles, and contamination of space on the floor. In this regard, the inventor studied to elevate, and lower racks circulating in the carousel using two chains arranged substantially on a diagonal line relative to the rack. By providing two chains at two diagonal positions of the rack, the rack can be elevated and lowered stably. However, in this case, since the chains are provided on both of the front and back surfaces of the rack, it is difficult to shield the front surface of the rack from the air containing dust particles emitted from a drive unit of the chains. Therefore, the inventor studied to shield the rack from the air containing dust particles emitted from the drive unit of the chains, and prevent the air containing dust particles from flowing out of the carousel at the time of transporting articles between the rack and an area outside of the carousel.

SUMMARY OF THE INVENTION

The present invention discloses a vertical carousel to elevate, and lower a rack in a stable orientation, and shield the rack and an area outside of a carousel from an air containing dust particles emitted from a drive unit of the rack.

The present invention also discloses a vertical carousel to prevent generation of air flow between floors through the vertical carousel.

According to the present invention, a vertical carousel has an endless drive member for vertically circulating a rack attached to the endless drive member. The vertical carousel includes, an inner wall surrounding an inner space for vertically circulating the rack, an outer wall surrounding the inner wall, the rack disposed in the inner space, and a pair of extensions provided at diagonal positions of the rack to protrude toward an outer space between the inner wall and the outer wall through slits of the inner wall. Each of the extensions is attached to the endless drive member. Further, the vertical carousel includes a drive mechanism for the endless drive member. The drive mechanism is provided in the outer space. A tunnel passes through the outer space to connect the inner space and an area outside of the vertical carousel for transportation of an article into, and out of the tunnel.

Preferably, the article is transported between floors, and the vertical carousel further includes an exhaust air space provided at least under a lowermost floor, and a fan filter unit for purifying an air in the outer space, and supplying the purified air into the inner space. An air pressure in the inner space is regulated to be higher than an air pressure in a floor around the vertical carousel, and an air pressure in the outer space is regulated to be lower than the air pressure in the floors, and higher than an air pressure in the exhaust air space under the floor.

If there is more than one exhaust air space, the air pressure of the outer space is regulated to be higher than the respective exhaust air spaces.

Particularly preferably, a fan filter unit for sucking an air from the area outside the vertical carousel into the inner space, and an exhaust air port for discharging the air from the outer space to the exhaust air space are provided.

Further, according to the present invention, a vertical transportation method of transporting an article between floors by attaching a rack to an endless drive member for vertically circulating the rack is provided. The vertical transportation method includes the steps of:

providing an inner wall surrounding an inner space for vertically circulating the rack, and providing an outer wall surrounding the inner wall;

providing the rack in the inner space, the rack having a pair of extensions at diagonal positions of the rack;

providing the endless drive member and a drive mechanism for the endless drive member in an outer space between the inner wall and the outer wall;

attaching the extensions of the rack to the drive member in a manner that the extensions protrude toward the outer space through slits of the inner wall; and providing a tunnel passing through the outer space to connect the inner space and the floors for transportation of an article into, and out of the tunnel.

Preferably, the vertical transportation method further includes the step of regulating an air pressure in the inner space to be higher than an air pressure in the floors, and regulating an air pressure in the outer space to be lower than the air pressure in the floors, and higher than an air pressure in an exhaust air space at least under one of the floors for preventing mixing of the air between floors.

In the specification, description regarding the vertical carousel is directly applicable to the vertical transportation method.

ADVANTAGES OF THE INVENTION

In the present invention, a pair of extensions are provided at diagonal positions of a rack. The extensions are attached to a drive member for vertical circulation. As a result, the rack can be circulated in a stable orientation. The inside of the carousel is partitioned into an inner space and an outer space. The extensions of the rack protrude toward the outer space from slits for allowing the rack to be driven by the drive member. The drive member and a drive mechanism for the drive member are disposed in the outer space. As a result, dust particles produced from the drive mechanism or the like do not enter the inter space significantly. Further, since the inner space and an area outside the carousel are connected by a tunnel extending through the outer space, the article can be transported into, or out of the tunnel without being exposed to the air in the outer space.

In the case where a fan filter unit for purifying the air in the outer space, and supplying the purified air into the inner space is provided, dust particles in the carousel can be treated in the carousel, and the amount of the contaminated air discharged to the outside can be reduced. Further, by increasing the air pressure in the inner space using the fan filter unit, the air pressure in the inner space can be regulated easily to become higher than the air pressure in the floor around the carousel. By sucking the air using the fan filter unit, the air in the outer space can be regulated easily to become lower than the air pressure in the floor.

By providing a fan filter unit for sucking the air from the area outside of the carousel, and supplying the air into the inner space, the air pressure in the inner space can be regulated easily to become higher than the air pressure of the outside floor. Further, by providing the exhaust air port or discharging the air in the outer space to the exhaust air space, the air pressure in the outer space can be regulated easily to become lower than the air pressure in the outside floor, and higher than the air pressure in the exhaust air space.

DESCRIPTION OF THE NUMERALS

Detailed Description of the Invention

Figure 1:
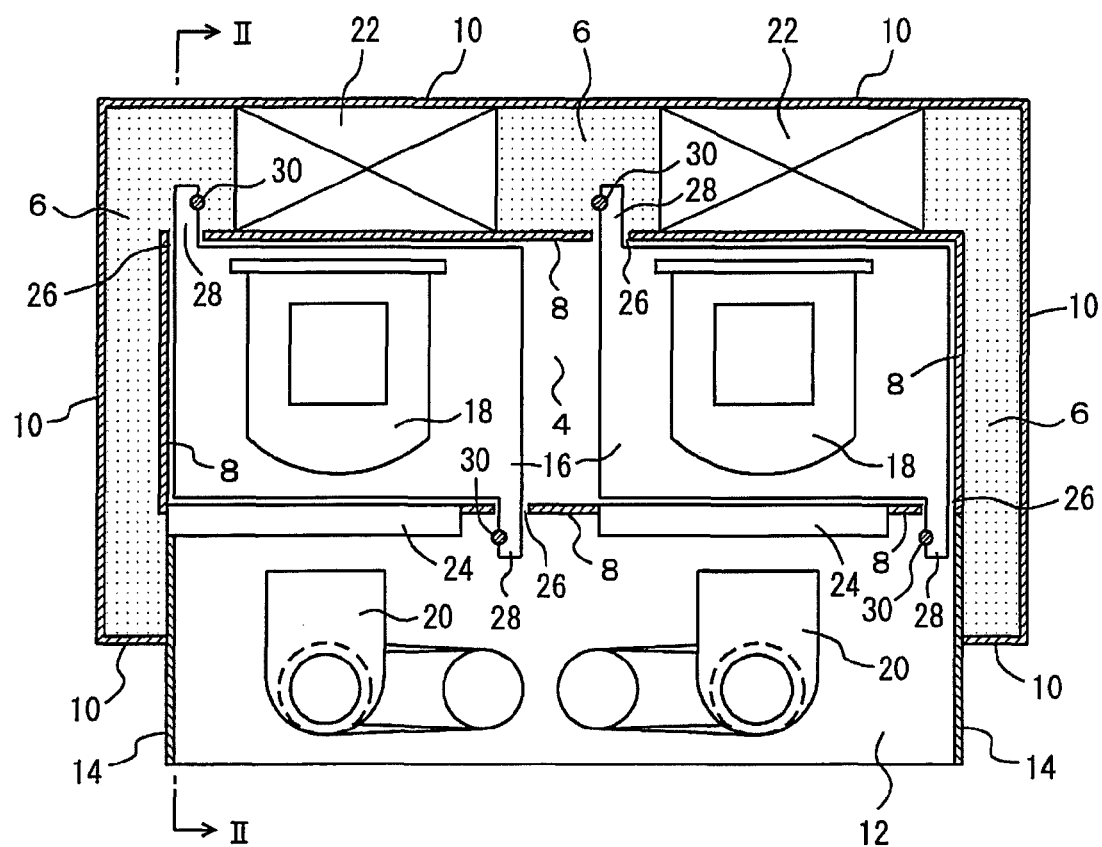
FIG. 1 is a horizontal cross sectional view of a vertical carousel according to an embodiment, showing inner and outer spaces and a tunnel.

FIGS. 1 to 4 show a vertical carousel 2 according to an embodiment. The vertical carousel 2 has dual cylindrical structure. A reference numeral 4 denotes an inner space of the vertical carousel 2 having the highest cleanness. A reference numeral 6 denotes an outer space surrounding the inner space 4. The spaces 4 and 6 are shielded from each other by an inner wall 8. A reference numeral 10 denotes an outer wall for shielding the outer space 6 from an area outside the carousel 2. The vertical carousel 2 has tunnels 12 at positions facing floor spaces F1, F2. Each of the tunnels 12 extends through the outer space 6 to connect the inner space 4 to the outside of the carousel 2. Further, a mechanical shutter 24 is provided in the tunnel 12. When an article such as a FOUP 18 is transported into, or transported out of the tunnel 12, the shutter 24 is opened. A reference numeral 14 denotes an outer wall of the tunnel 12.

Racks 16 are vertically circulated in the inner space 4. Each of the racks 16 has a pair of extensions 28 at diagonal positions (positions on a diagonal line) of the rack 16. The extensions 28 protrude toward the outer space 6 through slits 26 in the inner wall 8. Endless chains 30 or endless belts are attached to the extensions 28. By sprockets 34 and drive units 36 shown in FIGS. 2 and 3, the racks 16 are circulated in a vertical direction. The racks 16 are arranged in two rows in parallel along the vertical direction. The chains 30, the sprockets 34, and the drive unit 36 are provided in the outer space 6.

An article such as a FOUP 18 is placed on each rack 16. The type of the article can be determined arbitrarily. Further, a transfer robot 20 using a SCARA arm or the like is provided in the tunnel 12 so that the FOUP 18 or the like can be transferred between the rack 16 and the outside when the shutter 24 is opened. Though the transfer robot 20 is provided outside the shutter 24 in the illustrated embodiment, the shutter 24 may be provided at the exit of the tunnel 12, and the transfer robot 20 may be provided inside the tunnel 12. Fan filter units (FFU) 22 are provided at suitable positions in the outer space 6 for purifying the air in the outer space 6, and supplying the purified air into the inner space 4. Further, a fan filter unit (FFU) 32 is provided, e.g., on a ceiling of the vertical carousel 2 for purifying an air outside of the vertical carousel 2, and supplying the purified air into the inner space 4.

Figure 2:
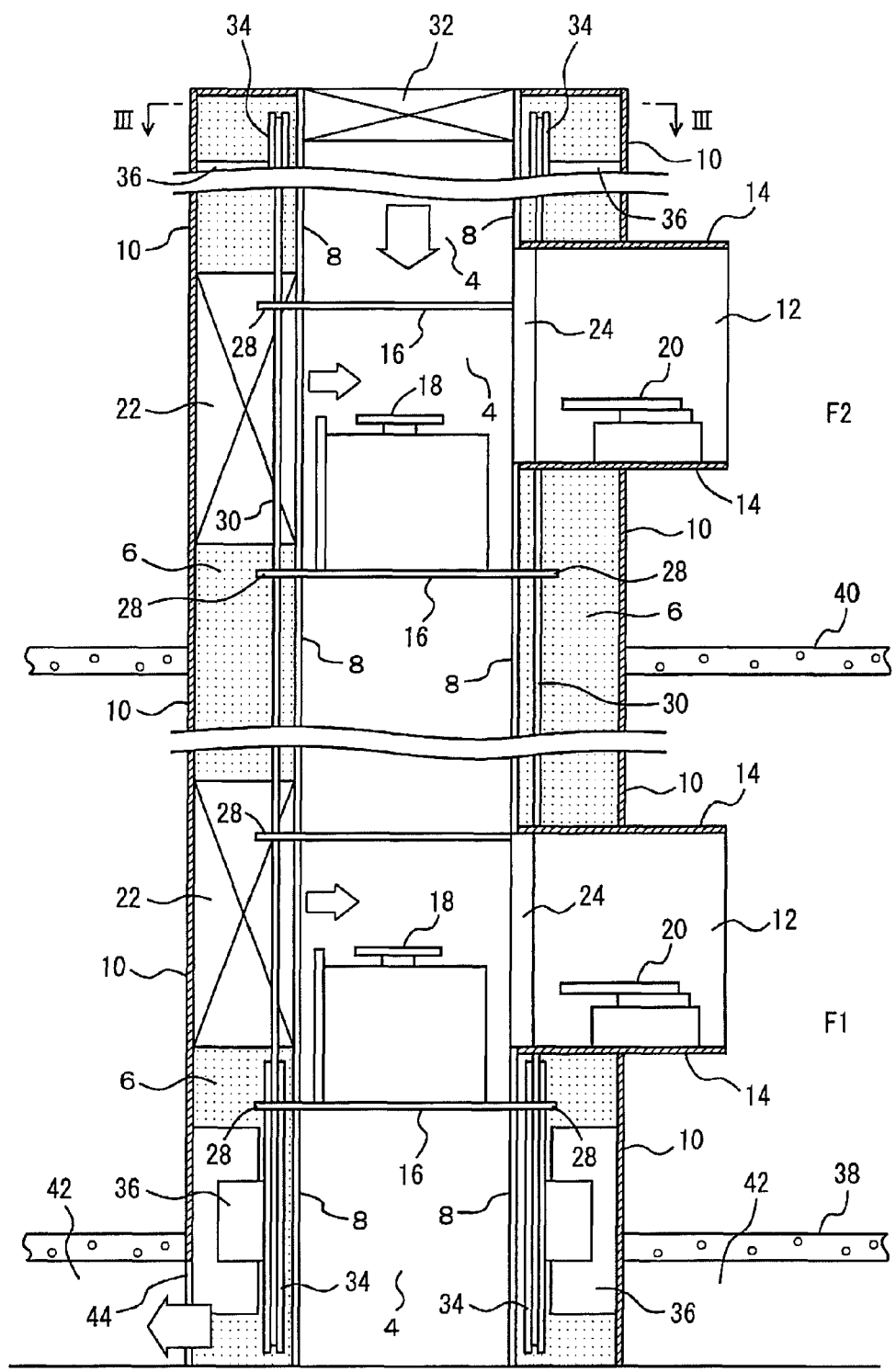
FIG. 2 is a vertical cross sectional view taken along a line II-II in FIG. 1, showing arrangement of the inner and outer spaces and the tunnel.
Figure 3:
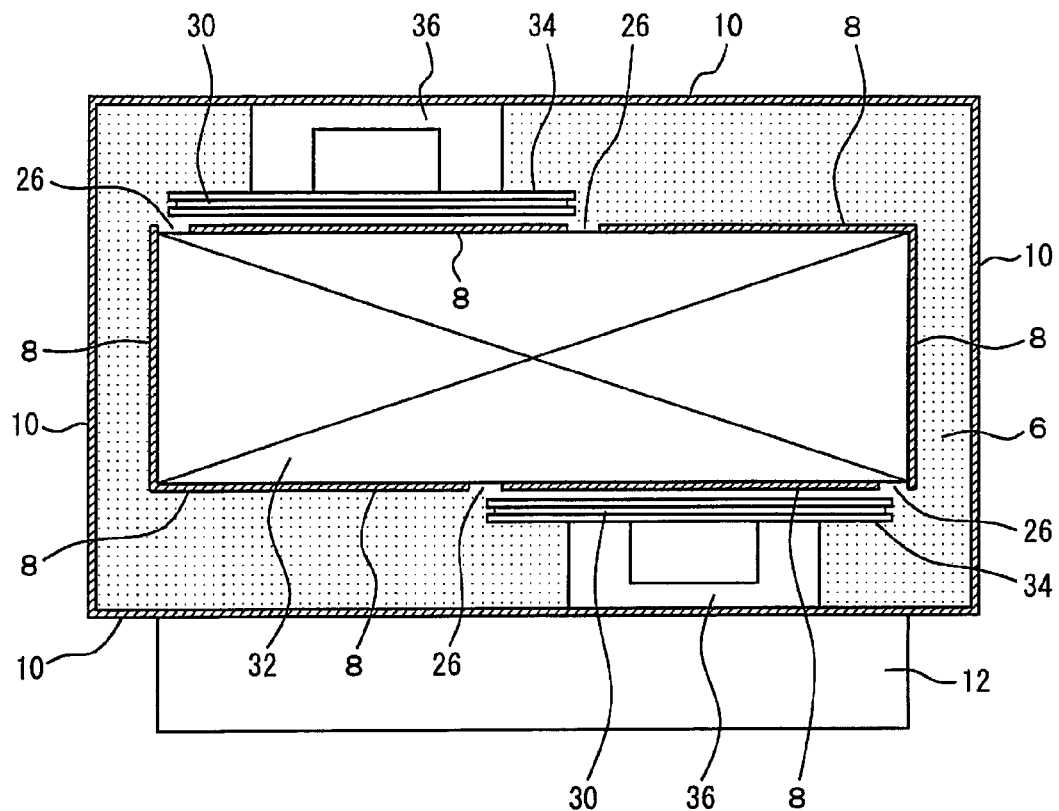
FIG. 3 is a horizontal cross sectional view taken along a line in FIG. 2, showing arrangement of chains and sprockets.

As shown in FIG. 2, the vertical carousel 2 passes through an area between the floor spaces F1, F2. Reference numerals 38, 40 denote floors. In FIG. 2, though transportation between the two floor spaces F1, F2 is shown, the number of floor spaces along the vertical direction can be determined arbitrarily. An exhaust air space 42 is provided under the floor 38, and the outer wall 10 has an exhaust air port 44 for discharging the air in the outer space 6 to the exhaust air space 42. Typically, an air sucking fan is provided in the exhaust air space, and the atmosphere is kept to have a negative pressure.

Operation of the embodiment will be described. By the sprockets 34, the racks 16 are circulated in the vertical direction through the chains 30. Each of the racks 16 is supported by the chains 30 at the two positions substantially along the diagonal line. Therefore, the rack 16 is not tilted significantly due to the load or the like from the FOUP 18. The rack 16 is oriented horizontally, and circulated vertically. When the rack 16 arrives at the floor space for transporting the article into, and out of the rack 16, the vertical circulation is stopped, and the shutter 24 is opened to transport the article between the rack 16 and an area the outside the vertical carouse 2. In the case of transporting articles to or from both of the floor spaces F1, F2 at the same time, the air flow may be produced between the floor spaces F1, F2 through the inner space 4. In the case where the cleanness of the floor space F1 and the cleanness of the floor space F2 are different, it is undesirable if an air flow from the space having the lower cleanness to the space having the higher cleanness is generated.

The cleanness in the vertical carousel 2 will be described. When a clean air is supplied to the inner space 4 by the upper fan filter unit 32, the clean air leaks from the slit 26 to the outer space 6, and the air is discharged from the exhaust air port 44 to the exhaust air space 42. The cleanness of the inner space 4 at least has the highest cleanness in the floor spaces F1, F2. Since the outer space 6 is shielded from the floor spaces F1, F2, and the inner space 4, as long as the outer space 6 has a suitable cleanness, no special requirement of the cleanness is present for the outer space 6.

Figure 4:
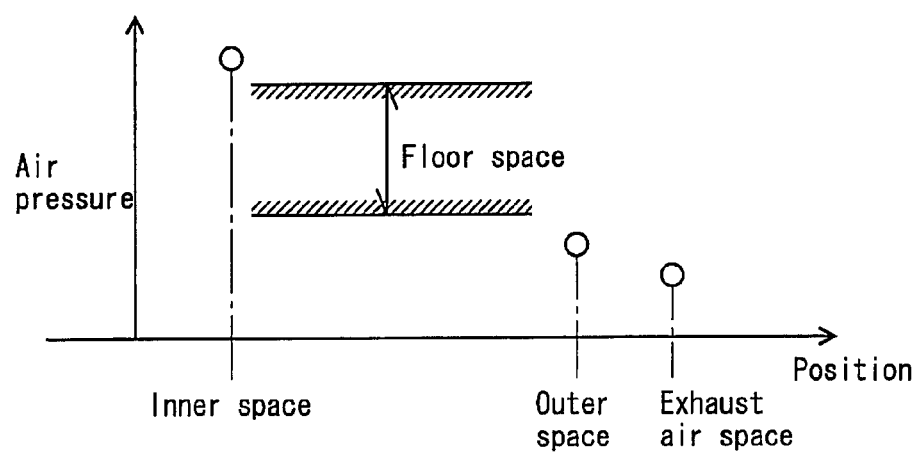
FIG. 4 is a view schematically showing atmospheric pressures in respective components in the embodiment.

FIG. 4 schematically shows air pressures in respective components of the vertical carousel 2. The air pressure in the inner space 4 is regulated to be higher than the air pressures in the floor spaces F1, F2, and the air pressure in the outer space 6 is regulated to be lower than the air pressure of any of the floor spaces F1, F2. The air pressure in the exhaust air space 42 is the lowest. A clean air is supplied from the fan filter unit 32 to the inner space 4 at all times, and the air in the outer space 6 is discharged from the exhaust air port 44 at all times. Further, the flow rate of the air supplied from the fan filter units 32 is regulated to be higher than the flow rate of the air flowing from the shutter 24 to the floor space. In this manner, even if the shutter 24 is opened, the air pressure in the inner space 24 does not change basically, and the air pressure in the inner space 24 remains higher than the air pressures in the floor spaces F1, F2. When the shutter 24 is opened, the air flow from the inner space 4 to the floor spaces F1, F2 is generated, and no counterflow of the air is generated. Therefore, mixing of the air between the floor spaces F1, F2 does not occur. Thus, stability of the cleanness is achieved in each of the floor spaces F1, F2.

The invention claimed is:
1. A vertical carousel for vertically circulating a rack attached to the endless drive member, the vertical carousel comprising:

first and second endless drive members which vertically circulate racks attached to the first and second endless drive members, such that articles on the racks can be transported between a plurality of floors;

an inner wall surrounding front, rear and both sides of an inner space in which the racks are vertically circulated, the racks being disposed in the inner space in two vertical columns;

an outer wall surrounding front, rear and both sides of the inner wall;

a pair of extensions respectively formed in front and rear diagonal corners of each of the racks, the protrusions each protruding toward an outer space between the inner wall and the outer wall through slits formed in the inner wall, the extensions protruding through a slit in the front of the inner wall being connected to the first endless drive member, which is disposed in front of the inner wall, and the extensions protruding through a slit in the rear of the inner wall being connected to the second endless drive member, which is disposed behind the inner wall;

a first drive mechanism for the first endless drive member disposed in the outer space in front of the racks, and a second drive mechanism for the second endless drive member disposed in the outer space behind the racks; and a plurality of tunnels, corresponding to the plurality of floors, passing through the outer space and connecting the inner space with an area outside of the vertical carousel for transportation of the articles and out of the inner space.

2. The vertical carousel according to claim 1, further comprising:

an exhaust air space provided at least under a lowermost floor among said plurality of floors; and a fan filter unit which purifies air in the outer space, and supplies the purified air into the inner space; and means for regulating an air pressure in the inner space to be higher than an air pressure in the floors around the vertical carousel, and for regulating an air pressure in the outer space to be lower than the air pressure in the floors and higher than an air pressure in the exhaust air space under the floor.

3. The vertical carousel according to claim 2, further comprising a fan filter unit which sucks air from the area outside the vertical carousel into the inner space, and an exhaust air port through which the air from the outer space is discharged to the exhaust air space.

4. The vertical carousel according to claim 2, further comprising transfer robots provided in each of the plurality of tunnels, the transfer robots being capable of transferring the articles between each of the racks.

5. The vertical carousel according to claim 1, wherein each of the plurality of tunnels has a mechanical shutter disposed therein.

6. A vertical transportation method of transporting an article between floors, comprising:

providing a vertical carousel comprising an inner wall surrounding front, rear and both sides of an inner space in which racks are vertically circulated, the racks being disposed in the inner space in two vertical columns, an outer wall surrounding front, rear and both sides of the inner wall;

first and second endless drive members which vertically circulate the racks attached to the first and second endless drive members, such that articles on the racks can be transported between a plurality of floors;

a pair of extensions respectively formed in front and rear diagonal corners of each of the racks, the protrusions each protruding toward an outer space between the inner wall and the outer wall through slits formed in the inner wall, the extensions protruding through a slit in the front of the inner wall being connected to the first endless drive member, which is disposed in front of the inner wall, and the extensions protruding through a slit in the rear of the inner wall being connected to the second endless drive member, which is disposed behind the inner wall;

a first drive mechanism for the first endless drive member disposed in the outer space in front of the racks, and a second drive mechanism for the second endless drive member disposed in the outer space behind the racks; and a plurality of tunnels, corresponding to the plurality of floors, passing through the outer space and connecting the inner space with an area outside of the vertical carousel for transportation of the articles and out of the inner space, and vertically circulating the racks using the first drive mechanism and the second drive mechanism.

7. The vertical transportation method according to claim 6, further comprising regulating an air pressure in the inner space to be higher than an air pressure in the floors, and regulating an air pressure in the outer space to be lower than the air pressure in the floors and higher than an air pressure in an exhaust air space under a lower most floor, for preventing mixing of the air between floors.

8. The vertical transportation method according to claim 6, further comprising transferring the articles between each of the racks using transfer robots provided in each of the plurality of tunnels.

9. The vertical transportation method according to claim 6, wherein each of the plurality of tunnels has a mechanical shutter disposed therein.

* * * * *